126
124
114
128
112
118
32
163
120
108
35
142
86
84
8
8
164
140
166
106
100
104
152
162
110
150
102
158
146
160
148
96
9
9
144
134
72
68
98
132
154
70
90
156
10
10
64
62
38
35
130
138
131
136
82
36
82'
28
11
78
78'
11
4
50
48
79
76
79

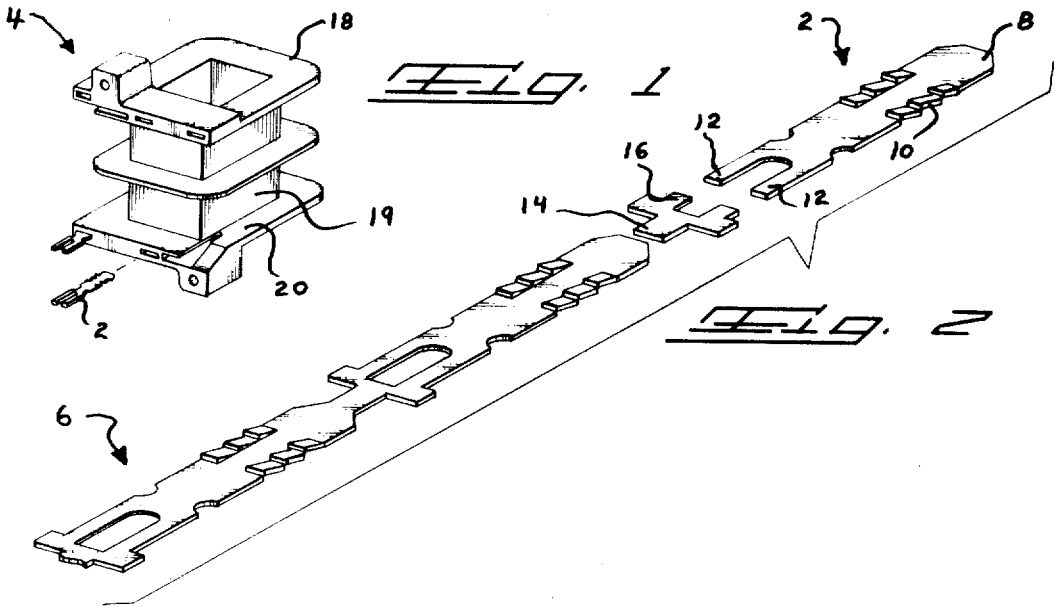
FIG. 1
FIG. 2
FIG. 3
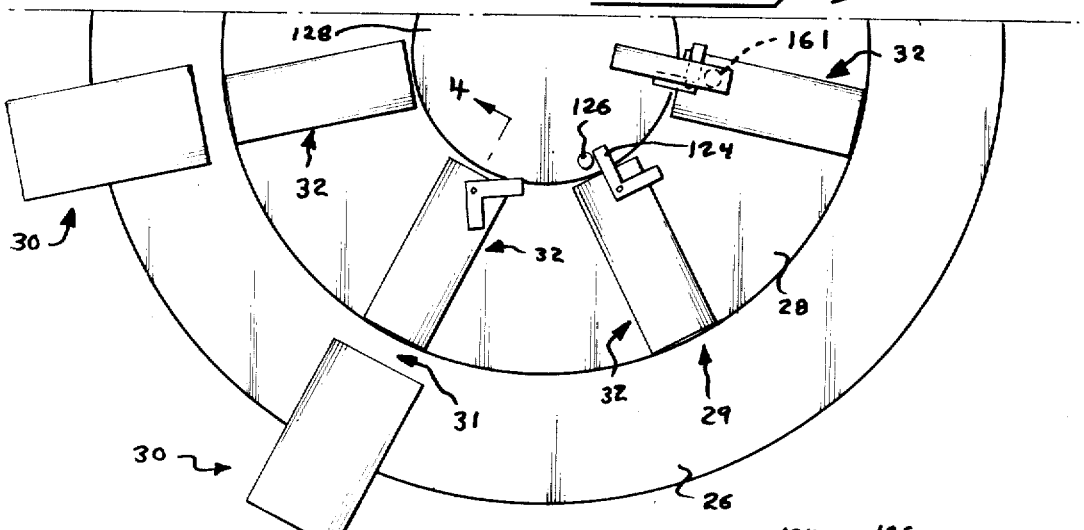
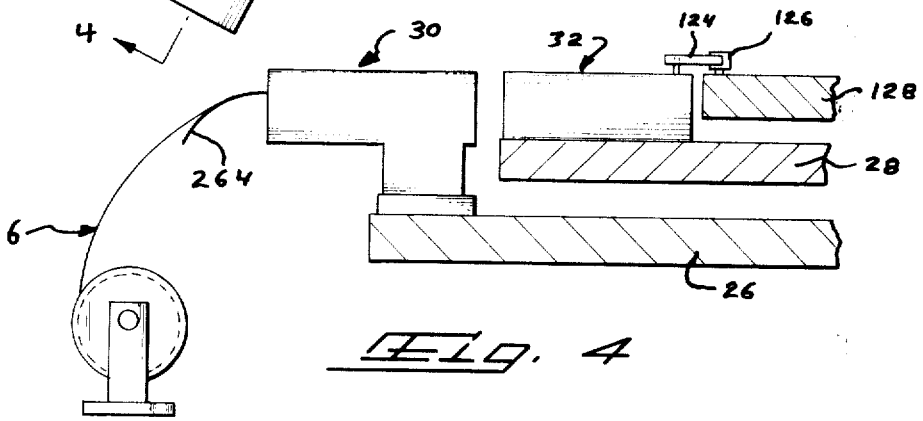
FIG. 4

76
78
79
79
78'
82
82'
80
80
81
81

United States Patent Office

Re. 28,119
Reissued Aug. 20, 1974

28,119

METHOD AND APPARATUS FOR INSERTING CONTACT MEMBERS INTO INSULATING BLOCKS

Willard Le Roy Busler, Kenneth Foster Folk, Howard Charles Phillips, and Milton Dean Ross, Harrisburg, Pa., assignors to AMP Incorporated, Harrisburg, Pa.

Original No. 3,556,382, dated Jan. 19, 1971, Ser. No. 749,122, July 31, 1968. Application for reissue July 6, 1971, Ser. No. 160,224

Int. Cl. H05k *3/00, 13/04*

U.S. Cl. 29—625 10 Claims

Matter enclosed in heavy brackets [ ] appears in the original patent but forms no part of this reissue specification; matter printed in italics indicates the additions made by reissue.

ABSTRACT OF THE DISCLOSURE

*A method and apparatus for inserting contact terminals into coil bobbins is disclosed. Apparatus comprises an indexible turntable having a plurality of bobbin holding jigs. A fixed table, located beneath the indexible turntable, has a plurality of bobbin inserters thereon. Bobbins are positioned in jigs and carried to inserters where terminals are inserted. In accordance with method aspect, the bobbins are moved towards the terminals to accomplish the inserting operation.*

[Apparatus for inserting contact terminals into insulating blocks, such as bobbins, comprises an indexible turntable, having a plurality of bobbin holding jigs mounted thereon, and a fixed table, located beneath the turntable, on which a plurality of terminal applicators are mounted. Bobbins are approximately positioned in the jigs at a loading station and are carried past the several inserting stations. Each bobbin jig has clamping means which is actuated between the loading station and the first inserting station and which clamps the bobbin to the jig and accurately positions it on the periphery of the turntable so that the bobbins are precisely located with respect to the several applicators at the inserting stations. The applicators are adjusted to insert a terminal into each of the several terminal receiving openings in the bobbins, each applicator being movable relatively towards and away from the turntable during an operating cycle to insert a single terminal.]

BACKGROUND OF THE INVENTION

The present invention is directed generally to apparatus for inserting terminals into insulating blocks and particularly for inserting terminals into coil bobbins or the like. The principles of the invention are also applicable to machines for inserting, for example, contact terminals into printed circuit board edge connectors and similar devices.

Vast numbers of electrical coils are used in, for example, the communications industry, and in the manufacture of motors, solenoids, and relays. These coils are ordinarily of small size and are wound on plastic bobbins which have a plurality of terminals mounted in their flanges. The terminals are used to connect the taps from the coil to the lead wires from the external circuits. The relatively small coils used are of widely varying configurations although vast numbers of such coils will lie within a relatively small range of dimensions. Because of the variations in the bobbin configurations, the operation of inserting the terminals into the coil bobbin flanges has heretofore constituted a relatively expensive and time consuming portion of the total cost of the bobbin. For this reason, there is a need for a versatile high speed inserting apparatus which is capable of automatically inserting terminals into coil bobbins or similar insulating blocks of varying shapes and sizes.

It is accordingly an object of the invention to provide an improved apparatus for inserting terminals into insulating blocks. A further object is to provide an automatic apparatus for inserting terminals into bobbins. A still further object is to provide a terminal inserting apparatus for coil bobbins which is adaptable of bobbins of varying sizes and shapes. A still further object is the provision of an apparatus capable of inserting terminals into bobbins at several nonaligned locations on the bobbin flange.

*A further object of the invention is to provide an improved method of inserting terminal members into insulating blocks such as bobbins.*

These and other objects of the invention are achieved in a preferred embodiment thereof comprising a rotatable and indexible turntable having a plurality of bobbin holding jigs mounted at spaced intervals on its periphery. Each bobbin holding jig is adapted to receive an approximately located bobbin and has means thereon for clamping the bobbin during an indexing cycle of the table in a manner such that the bobbin is precisely located and firmly clamped at a predetermined position on the periphery of the turntable. A plurality of inserting mechanisms or applicators are provided on a fixed table which is mounted below the turntable and located at each of the several inserting stations so that as the bobbins are presented to each inserting station, a single terminal will be inserted into one opening in the bobbin. The inidividual applicators are adjustably mounted on the fixed table so that they are capable of inserting a terminal at any location within a predetermined area which is representative of the area occupied by the bobbins at the insertion station. In this manner, it is merely necessary to adjust the position of each applicator relative to the turntable to insert terminals into any one or all of several openings which are in the bobbins which are adapted to receive terminals. By virtue of this feature, and other features described more specifically below, an apparatus in accordance with the invention can be adapted to accommodate bobbins of varying sizes and shapes with equal efficiency.

IN THE DRAWINGS

FIG. 1 is a perspective view of one type of coil bobbin having openings in its flanges which are adapted to receive terminals;

FIG. 2 is a perspective view of a short section of terminal strip, one terminal being broken away from the strip to illustrate the manner in which the strip is severed in the apparatus in accordance with the invention.

FIG. 3 is a diagrammatic plan view showing one-half section of an apparatus in accordance with the invention;

FIG. 4 is a sectional side view of the apparatus of FIG 3;

Figure 5:
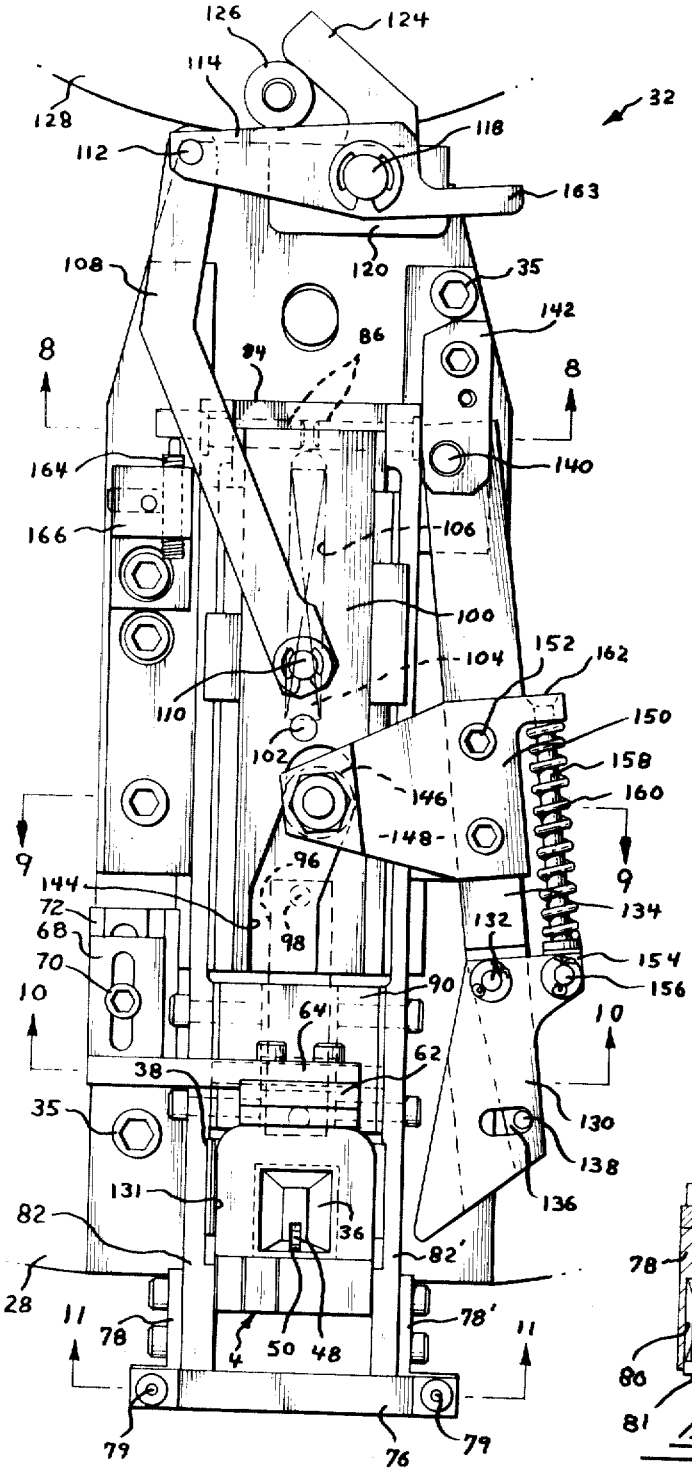
FIG. 5 is a plan view of a bobbin holding jig, this view showing the positions of the parts when the jig is opened and prior to clamping of the bobbin.
Figure 7:
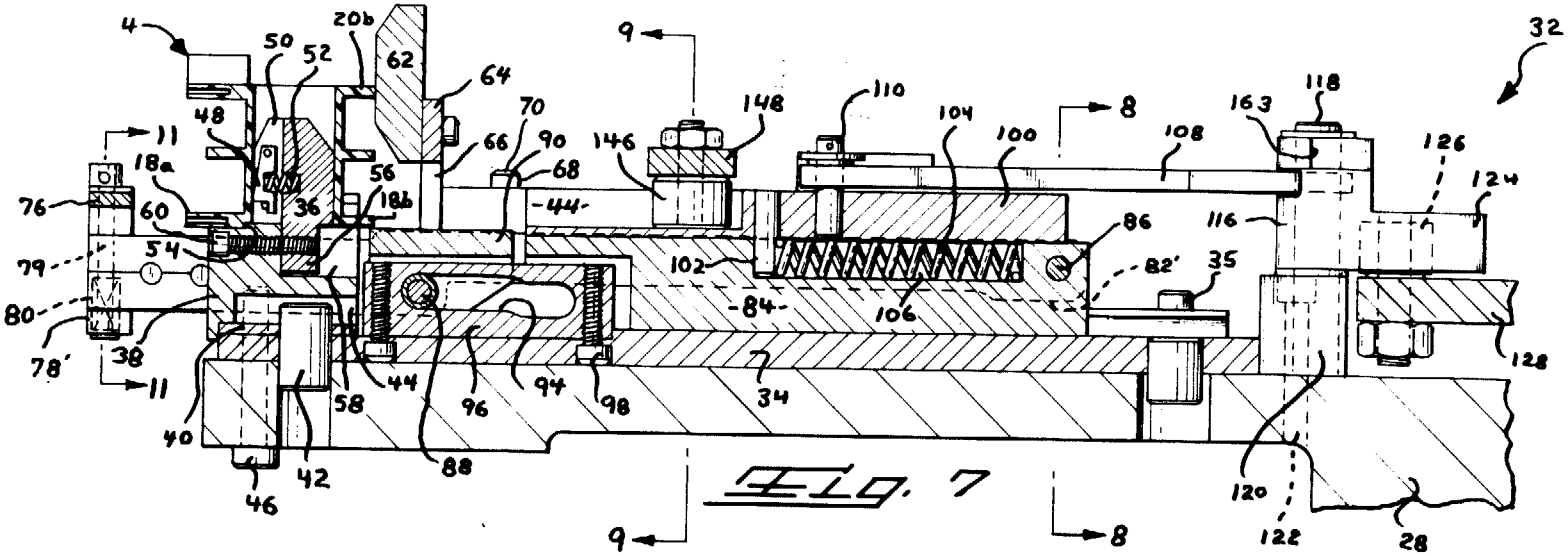
FIG. 7 is a sectional side view of the jig of FIGS. 5 and 6 showing the positions of the parts prior to clamping of the bobbin.
Figure 7A:
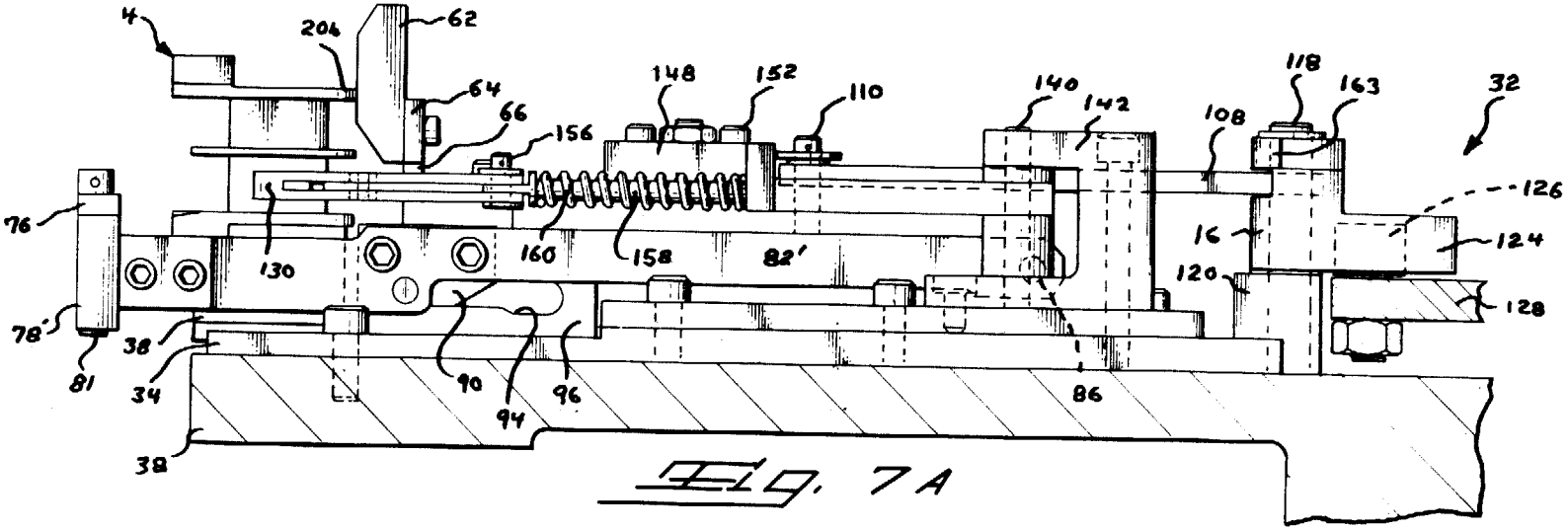
FIG. 7A is an unsectioned side view of the jig showing the positions of the parts prior to clamping of the bobbin.
Figure 12A:
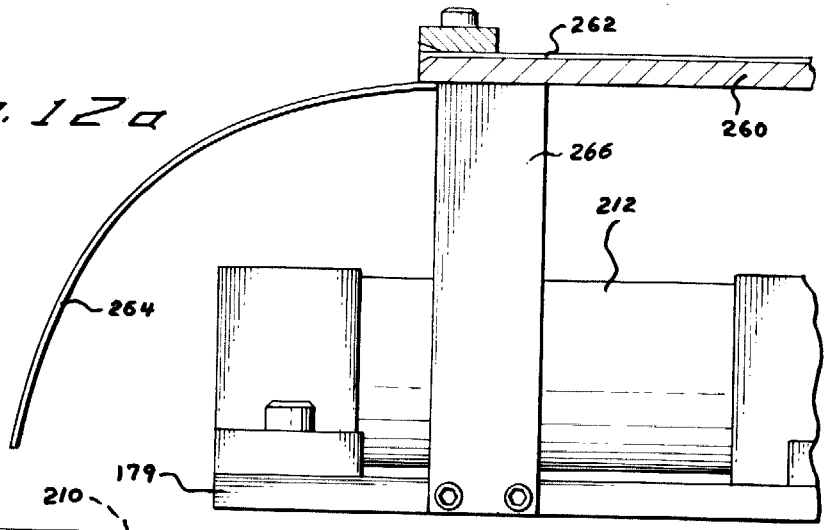
Figure 12B:
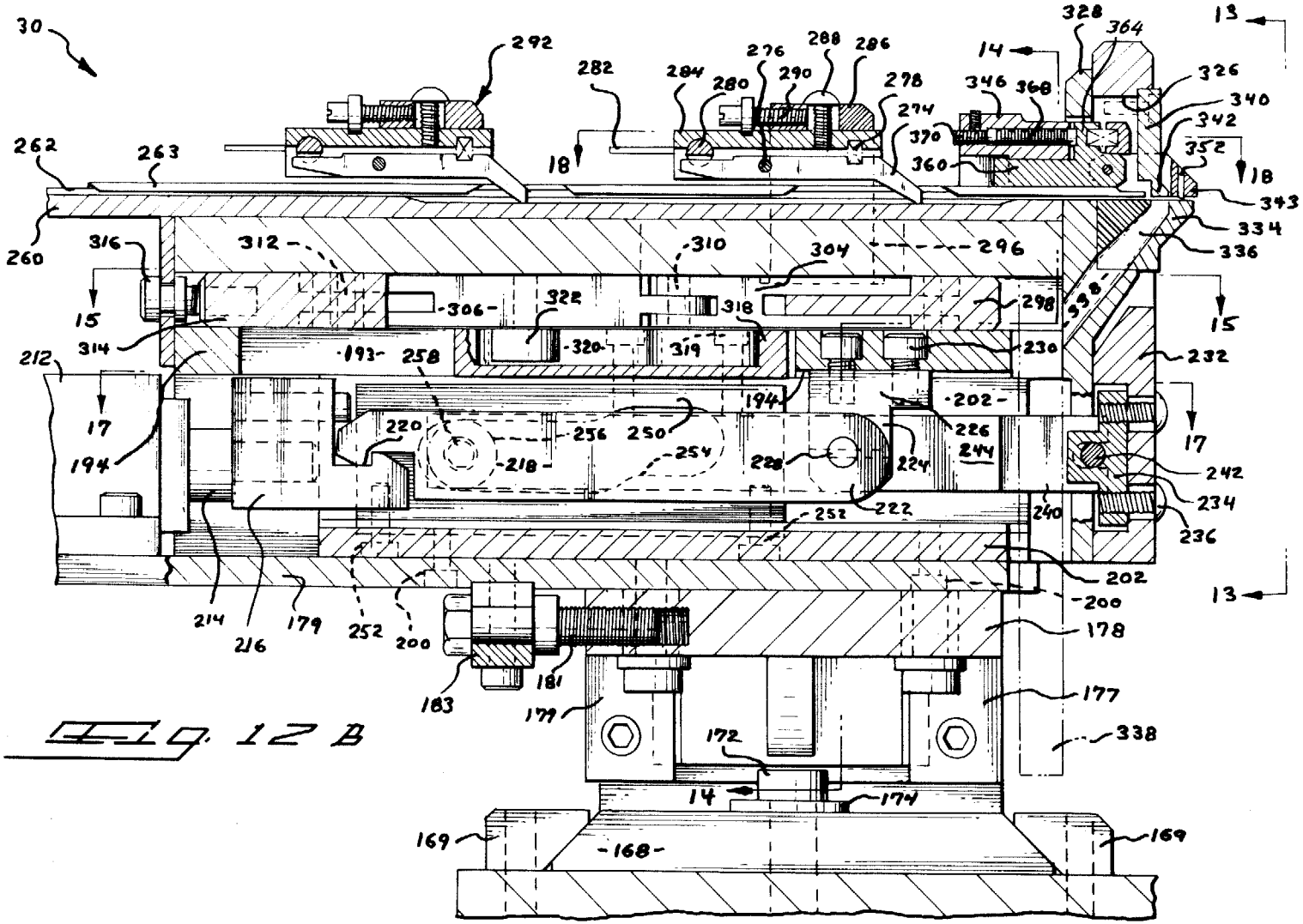
Figure 13:
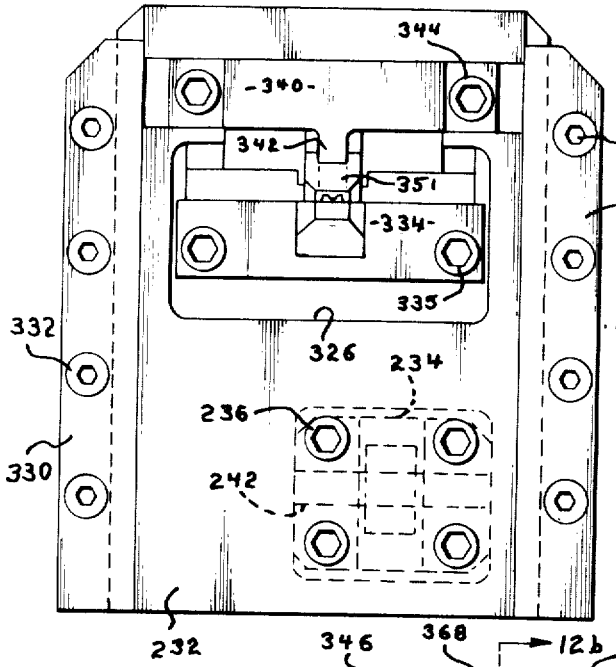
Figure 15:
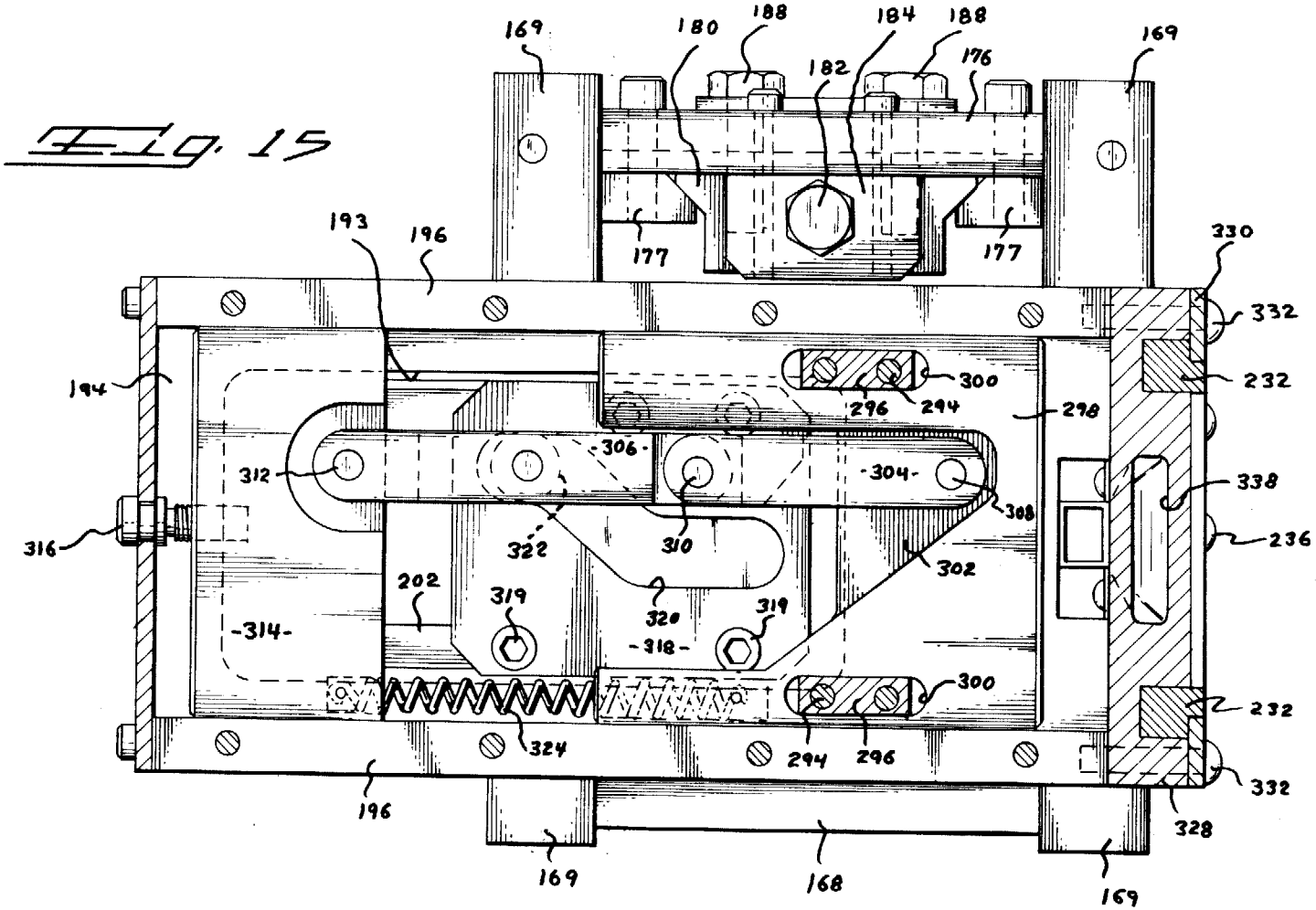
Figure 16:
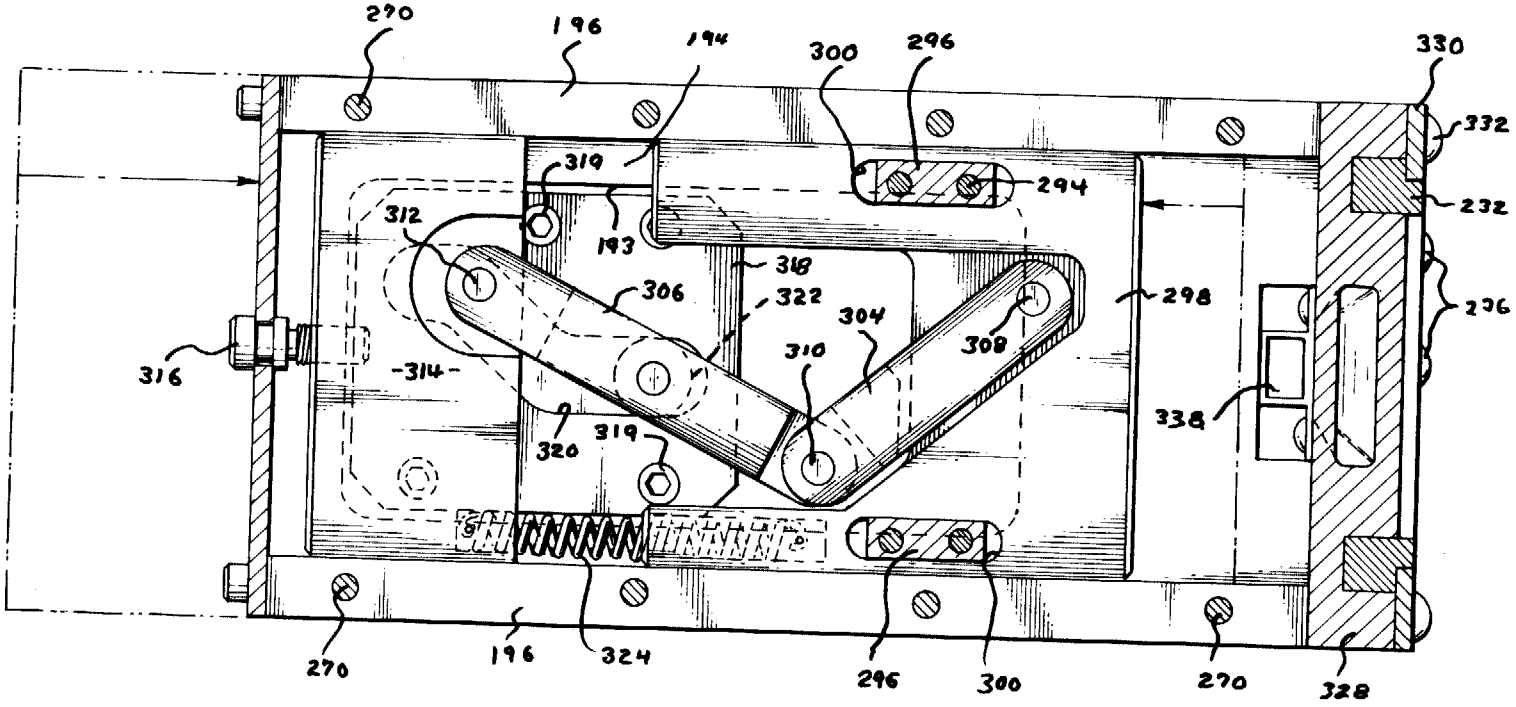
Figure 19:
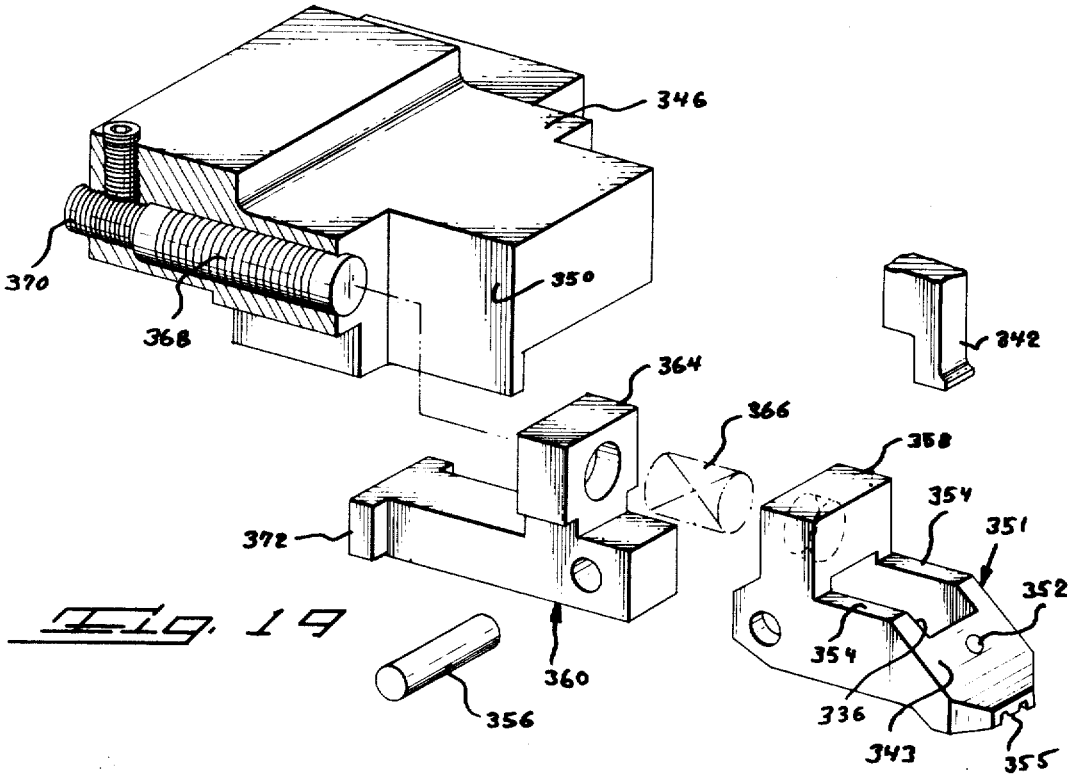
Figure 20:
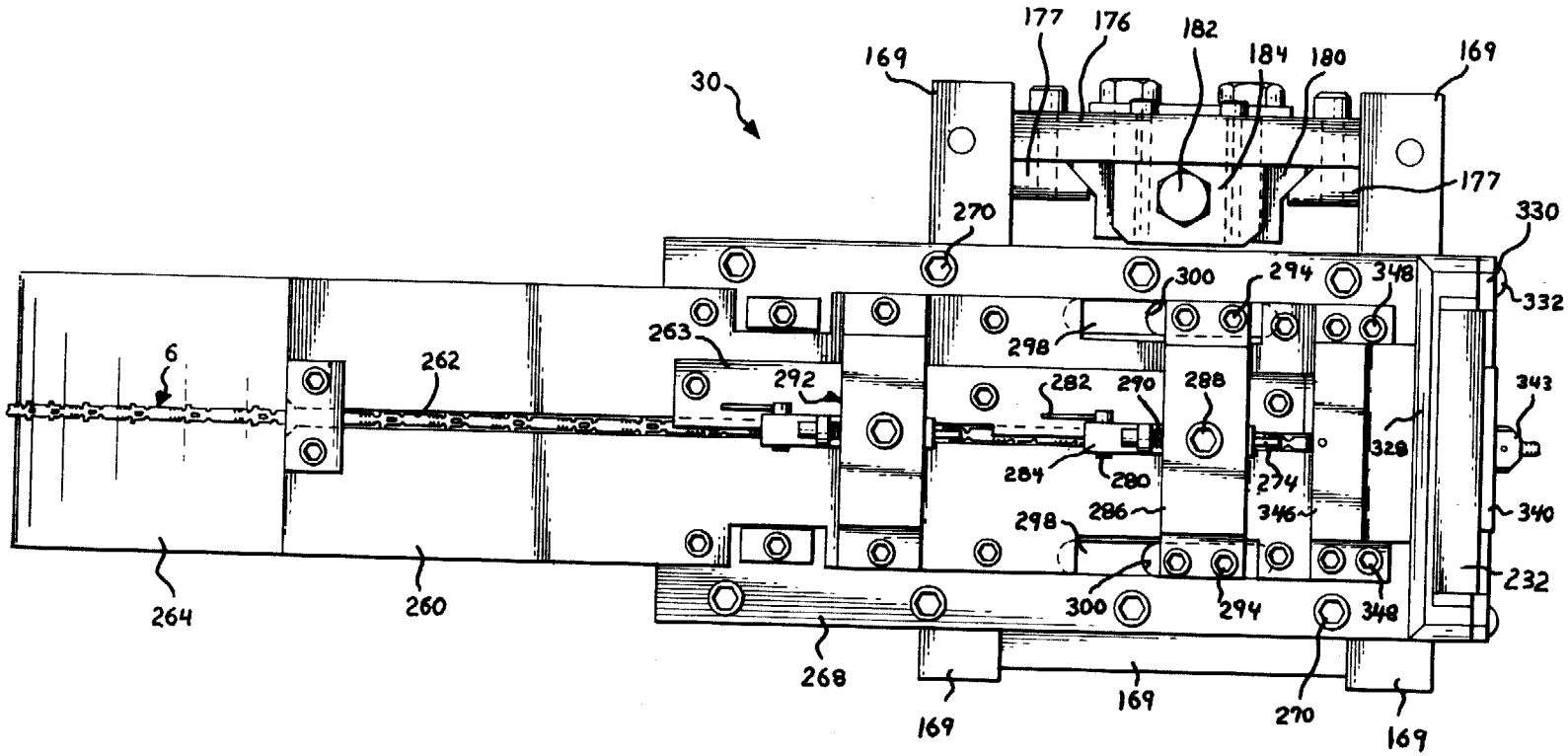

FIGS. 8, 9, 10, and 11 are views taken along the lines 8—8, 9—9, 10—10, and 11—11 of FIGS. 5 and 7;

FIGS. 12A and 12B (which are intended to be placed beside each other) present a sectional side view of an inserter of applicator in accordance with the invention;

FIGS. 13, 14, 15, 17, and 18 are sectional views taken along the lines 13—13, 14—14, 15—15, 17—17, and 18—18 of FIG. 12;

FIG. 16 is a view similar to FIG. 15 but showing the positions of the parts at an intermediate stage of the operating cycle;

FIG. 19 is an exploded perspective view showing details of a terminal clamping means; and FIG. 20 is a top plan view of the inserter shown in FIGS. 12A and 12B.

Referring first to FIGS. 1 and 2, the disclosed embodiment of the invention is adapted to insert terminals 2 into bobbins which are generally indicated at 4. Each bobbin comprises a transversely extending spool portion 19 having flanges generally indicated at 18 and 20 on its ends, at least one of these flanges being provided with a plurality of openings in its edge which are adapted to receive individual contact terminals 2. The terminals are manufactured in the form of a continuous strip 6, each terminal comprising a leading end 8 which is inserted into the bobbin hole having a plurality of lances 10 on its sides which prevent removal of the bobbin from the hole after insertion. The trailing end of the terminal, which projects from the bobbin opening after insertion, is in the form of a spade having spaced-apart tynes 12. The individual terminals are connected to each other by transition pieces 14, 16 which are slugged or severed from the strip in a manner described below at the time of insertion.

As shown in FIGS. 3 and 4, the disclosed embodiment of the invention comprises a fixed circular table 26 and a turntable 28 mounted above the fixed table. The turntable is adapted to be indexed at periodic intervals by any suitable indexing means to present the individual bobbins mounted on work holding jigs 32 successively to each of the several insertion heads or applicators 30 mounted on the fixed table 26. The bobbins 4 are loaded in the work holding jigs 32 at the loading station indicated at 29 in FIG. 3 and while the jig is moving from the loading station to the first insertion station 31, the bobbin is firmly clamped and accurately positioned on the periphery of the turntable so that it will be precisely located with respect to the applicators. In the description which follows, the work holding jigs will first be described in detail and a description of the structural features of the applicators will be presented following this description of the work holding jigs.

Referring now to FIGS. 5–11, each work holding jig 32 is mounted on the upper surface of the turntable 28 and arranged radially with respect to the turntable so that its bobbin holding elements are disposed adjacent to the periphery of the turntable. Each jig comprises a base plate 34 secured to the turntable by fasteners 35 and having a mandrel, generally indicated at 36, at its left-hand end as viewed in FIG. 7. The mandrel 36 is a cross section conforming to the opening which extends through the spool portion of the bobbin and is mounted on, and removably secured to, a mandrel block or base 38 which rests upon a spacer plate 40, fasteners 46 extending through the turntable, through the base plate, through the spacer plate, and into the mandrel block to secure the mandrel block in position. Accurate location of the mandrel block on the base plate is achieved by means of a pin 42 mounted in an opening in the turntable and extending into an elongated slot 44 on the underside of the mandrel block. A detent 48 is mounted in a slot 50 on the left hands side of the mandrel and is resiliently biased leftwardly by means of a spring 52, to bias the bobbin mounted on the mandrel leftwardly and facilitate its removal, after the terminals have been inserted, at the removal station of the apparatus. Accurate location of the bobbin is also achieved by means of a shoulder 54 on the lower most flange in FIG. 7 which bears against a corresponding shoulder on the upper surface of the mandrel block. This shoulder on the mandrel block extends entirely across the flange and is commonly provided in order to permit positioning of a bobbin on a suitable work holder.

Advantageously, the mandrel is removable from the mandrel block 38 in order to permit use of mandrels of different shapes or sizes for different types of bobbins. In the disclosed embodiment, the mandrel has a depending boss 56 which extends into a slot 58 in the upper surface of the mandrel block and is secured in this slot by means of a fastener 60 extending inwardly from the front side of the mandrel block.

When the individual bobbins are mounted or positioned on the mandrel at the loading station, one of the rearwardly extending flanges **20*b*, as viewed in FIG. 7, is located against a surface of a positioning block 62 which is secured to, and extends from, an arm 64 of a bracket. This bracket extends upwardly as shown at 66 from a base 68 and is secured to the base plate and to a support block 72 by suitable fasteners 70. As will be apparent from the description which folows, when the bobbin is firmly clamped on the jig, the flange 20*b* is moved firmly against the surface of the block 62** by a clamping mechanism.

Figure 11:
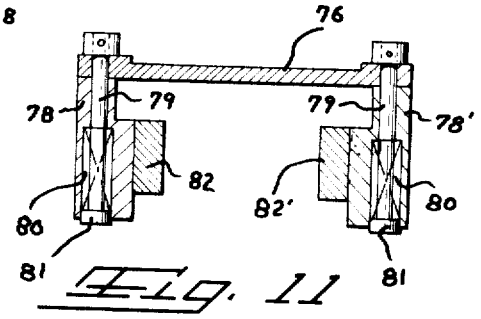

The bobbin mounted on the mandrel is clamped firmly against the surface of the block 62 and its shoulder 54 is clamped against the shoulder on the upper surface of the mandrel block by means of a clamping bar 76 which extends transversely of the bobbin and above the inner surface of the flange indicated at **18*a*. Referring to FIG. 11, the ends of the clamping bar 76 are supported on blocks 78, 78′ by means of pins 79 which extend through the ends of the clamping block and through recesses in the lower ends of the blocks 78, 78′. Springs 80 surround the lower ends of these pins and bear against the inner surfaces of these recesses and against the lower heads 81 of the pins. This construction permits the clamping bar 76 to be displaced relatively upwardly with respect to the blocks 78, 78′, by a slight amount against the biasing force of the springs 80 when the clamping bar moves inwardly and against the inner surface of the flange 18*a*** as will be apparent from the description which follows.

The blocks 78, 78′ are secured to the ends of arms 82, 82′ which are mounted on each side of a main slide block 84. These arms extend rearwardly toward the right-hand end of this slide block as viewed in FIG. 7, the ends of the arms 82, 82′ being pivotally mounted on pins 86 (see FIG. 8) thereby to permit a slight downward pivoting of the arms and the clamping bar 76 when the slide block 84 moves rightwardly as viewed in FIG. 7.

Figure 10:
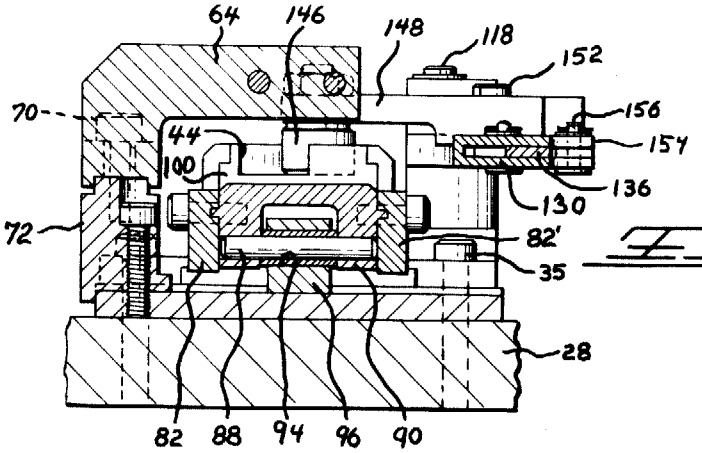
Figure 7B:
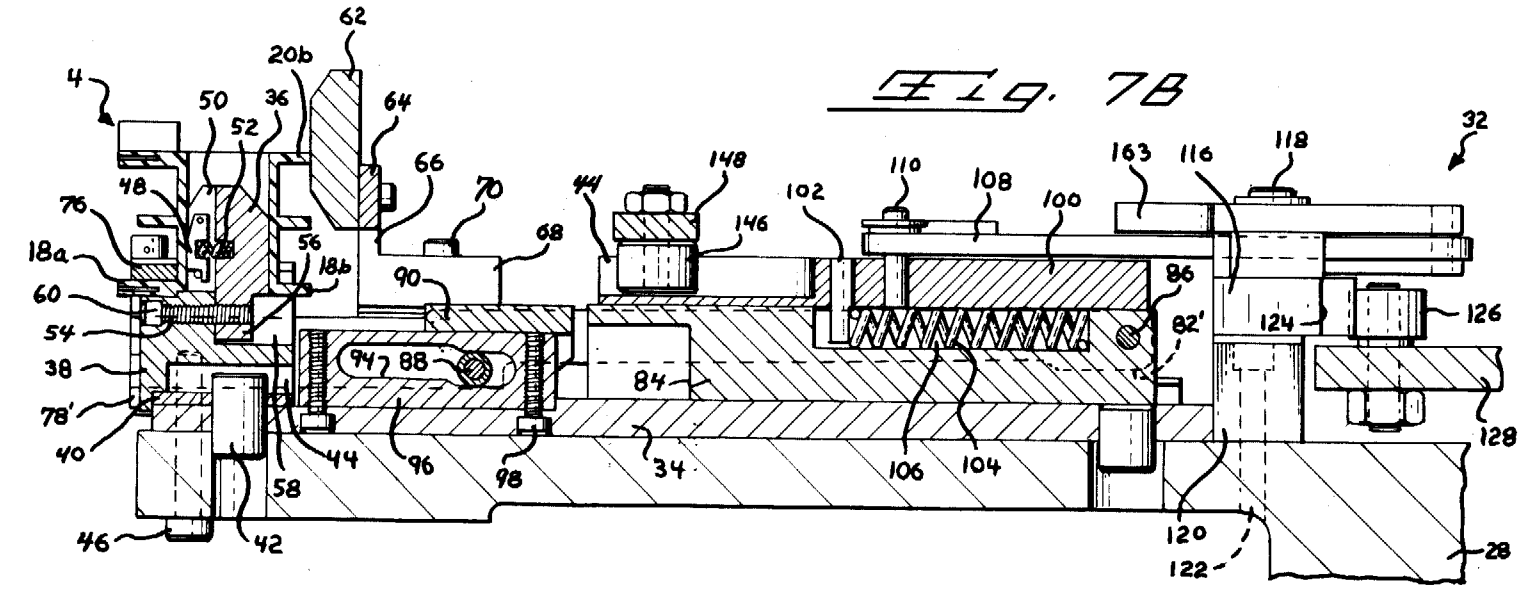
FIG. 7B is a sectional view similar to FIG. 7 but showing the positions of the parts after the bobbin has been clamped.

The arms 82, 82′ are swung through a slight arc, to move the clamping bar 76 downwardly, by means of a cam roller 88 contained in a housing 90 which extends between, and is interengaged at 92 with the arms 82, 82′ at the left-hand hand end of the slide block 84, see FIG. 10. The block 90 has a central recess on its underside which straddles a fixed cam block 96 secured by fasteners 98 to the base plate 34. This cam block has a slot 94 through which the roller extends, this slot being contoured such that a slight downward movement of the arms will take place during the rightward movement of the slide block 84 which will be apparent from FIG. 7.

The slide block 84 is moved rightwardly, while the turntable transports the jig from the loading station to the first insertion station, by means of a connecting rod 108 which is coupled to the slide block 84 by means of an additional block 100. The block 100 is slidably mounted on the upper surface of the slide block 84 and has a pin 102 extending downwardly intermediate its ends and into a slot 106 in the upper surface of the slide block. A spring 104 is contained in the slot 106 and bears at one end against the lower end of the pin 102 and at its other end against the rearward wall of the slot 106. Spring 104 is relatively stiff so that relative rightward movement of the link 108 will initially cause rightward movement of the slide block but when the slide block reaches the limit of its travel as determined by a stop described below, further movement of the link and the block 100 relative to the slide block is permitted with concomitant compression of the spring.

The connecting rod 108 has one of its ends pivotally connected to the projecting end of the pin 110 and is pivotally connected at its other end 112 to one arm 114 of a bell crank. As shown best in FIG. 5, the connecting rod 108 is of dog-leg shape to permit overtravel of the block 100 in a manner which will be described below.

The arm 114 of the bell crank is integral with, and extends from, a central bearing boss portion 116 which is mounted on a pin 118 extending into a support block 120 which, in turn, is mounted on the upper surface of the turntable 28 by fasteners 122. The other arm 124 of the bell crank structure, which is angularly spaced from the arm 114, is disposed in a plane beneath the plane of the arm 114 and is adapted to be engaged by a cam roller 126 mounted on a fixed plate 128. The cam roller 126 is disposed between the loading station and the first insertion station of the apparatus so that when the turntable indexes and a bobbin holding jig moves from the loading station to the first insertion station, the bell crank 124, 114 will be swung through a clockwise arc as viewed in FIG. 5 to move the slide member 84 rearwardly to the position of FIG. 6. As previously explained, this results in rightward movement, as viewed in FIG. 7, of the clamping bar 76 so that it moves against the inner surface of the flange 18*a* of the bobbin, clamps the bobbin flange 20*b* against the surface of the block 62, and at the same time, clamps the flange 18*a* against the shoulder on the upper surface of the mandrel block 38.

Figure 6:
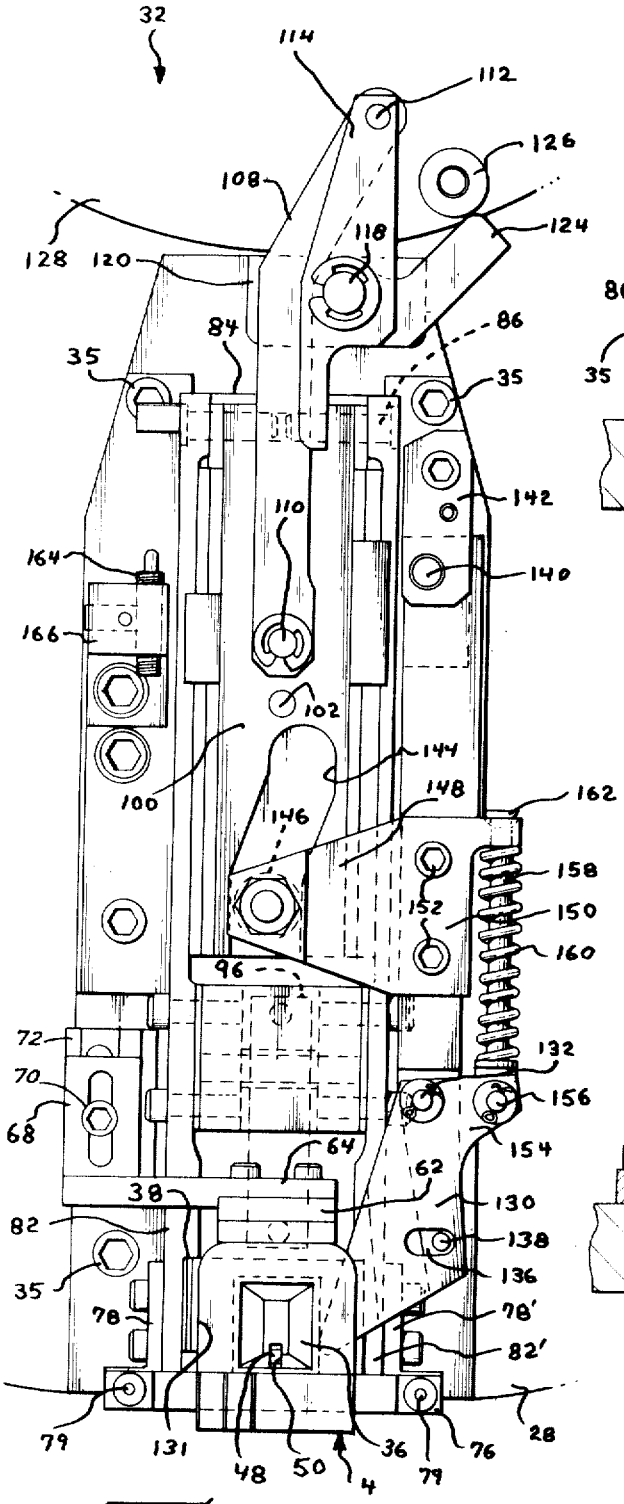
FIG. 6 is a view similar to FIG. 5 but showing the positions of the parts when the clamping mechanism on the jig is closed.
Figure 8:
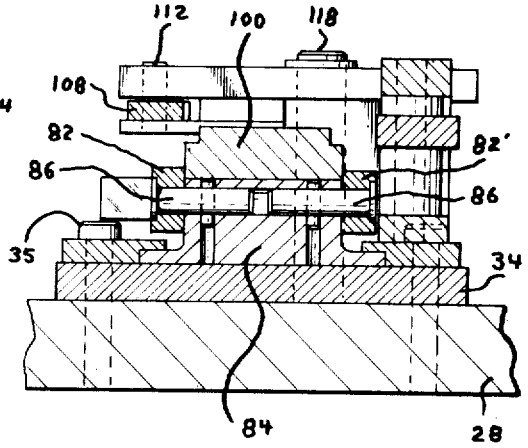
Figure 9:
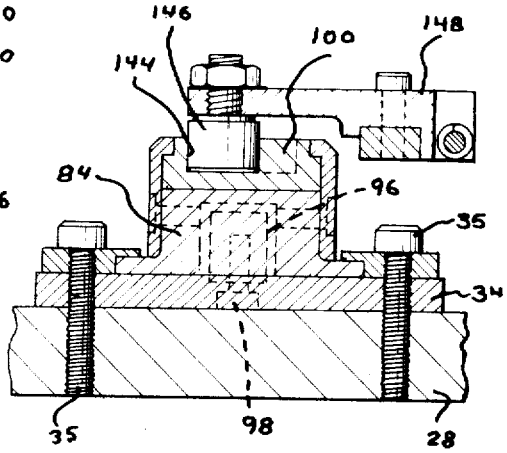

The bobbin which is mounted on the mandrel is also positioned and clamped accurately in a horizontal plane and along the line extending at right angles to the direction of movement of the clamping bar 76 by means of a side clamp member 130 which moves leftwardly from the position of FIG. 5 to the position of FIG. 6 to push the bobbin against the surface of a clamping plate 131 mounted on and extending from the base plate 34. The clamping member 130 comprises a pair of spaced apart relatively thin plates which are pivotally mounted at 132 on the opposite sides of the reduced diameter end portion 136 of a clamping arm 134. The pivotal movement of the clamping member 130 is limited by means of a pin 138 mounted in the reduced diameter end 136 of the clamping arm which extends through suitable slots in the clamping member 130. The clamping arm 134 extends alongside the arm 82' obliquely in FIG. 5 towards the rearward end of the positioning and holding jig and is pivotally mounted at its end 140 on a bracket 142 secured to the base plate 34. The arm 134 is swung through a slight clockwise arc during rearward movement of the slide block 84 by means of a cam slot 144 on the upper surface of the block 100. The cam slot 144 receives a cam follower 146 which is mounted in the end of a laterally extending bracket 148 which is secured, in turn, to the arm 134 intermediate its ends by fasteners 152. It will thus be apparent that upon rearward movement of the slide block 84, the follower 146 will move leftwardly as viewed in FIGS. 5 and 6, by virtue of the contour of cam slot 144, to swing the arm 134 through the clockwise arc which causes movement of the clamping member 130 against the right-hand side of the bobbin. In the event of overtravel of the slide member, as will be explained below, the clamping members 130 are permitted to remain stationary and resilienty biased against the side of the spool portions of the bobbin by virtue of the pivotal connection 132 between these clamping members and the arm 134. In the disclosed embodiment, the clamping members 130 have laterally extending ears 154 to which a rod 158 is pivotally connected at 156. The opposite end of this rod is mounted at 162 in an extension on the base portion 150 of the bracket 148 and a spring 160 surrounds this rod and bears against a suitable collar adjacent to the ear 154. If overtravel of the arm 134 takes place, the clamping members 130 pivot slightly with respect to the arm 134 and the spring 162 will be compressed. When the parts return to their normal positions, the clamping members 130 are returned to the position shown in FIG. 5 by the spring 160.

The forward movement of the slide block 84 is limited by an adjustable stop pin 164 which is threaded into a bracket 166 mounted on the upper surface of the base plate 34.

It will be apparent from the foregoing description that when a bobbin is placed on the mandrel at the loading station, it need only be approximately positioned and properly orientated by the operator. As the jig on which the bobbin has been placed moves from the loading station to the first insertion station, the connecting rod 108 will be moved from the position of FIG. 5 to the position of FIG. 6 thereby effecting clamping of the bobbin securely to the mandrel by both the clamping member 130 and the clamping bar 76. As best shown in FIG. 6, the pivotal connections 110, 118, and 112 are in substantial alignment with each other when the bobbin is clamped in the jig and, in fact, there may be some overtravel so that the pivotal connection 112 between the belt crank arm 114 and the connecting rod 108 would be slightly to the right of the position shown in FIG. 6. The bobbin will thus be resiliently and firmly held in position. At the unloading station, a suitable opening cam roller 161, which is also mounted on the plate 128, engages an additional arm 163 extending from the bearing boss portion 116 of the bell crank. This additional follower swings the bell crank 114, 124 to the position shown in FIG. 5 thereby to release the clamping pressure on the bobbin and permit its removal.

Referring now to FIGS. 12A–20, the individual inserting mechanisms 30 are each mounted on the fixed table 26 by means of adjustable pedestal structures so that they can be individually adjusted to insert a terminal at any location within a predetermined target area occupied by the bobbins. As shown best in FIGS. 12B, 14, and 15, each adjustable supporting structure comprises a base plate 168 mounted on the upper surface of the fixed table 26 between gibs 169 and clamped to the upper surface of the fixed table by means of fasteners 172 which extend through a clamping plate 174 and through slots 170 in the base plate 168. Each base plate has a vertically extending support flange 176 against which a vertically adjustable applicator support plate 178 is mounted. The vertically adjustable plate 178 has a side portion 180 which is slidably contained between gibs 177 on the sides of the flange 176. Vertical adjustment of the positions of the plate 178 is achieved by means of a jackscrew 182 which is threaded through the side portion 180 of the plate 178 and has a reduced diameter end 186 which is received in a suitable opening in the base plate 168. The upper end of this jackscrew is rotatably supported in a fixed bearing block 184 mounted on the upper end of the flange 176. Plate 178 can be clamped in any desired position of adjustment by means of clamping screws 188 which extend through suitable slots in the flange 176 and are threaded in the side portion 180 of the plate 178.

The inserter itself is mounted on a support plate 179 which, in turn, is adjustably supported on the upper surface of the plate 178, precise adjustment may be achieved by means of a screw 181 which extends through a yolk 183 on the underside of the support plate 179 and is threaded into the vertically adjustable support plate 178. Again, suitable clamping screws are provided to clamp the applicator or inserter in a precise position of adjustment.

Figure 14:
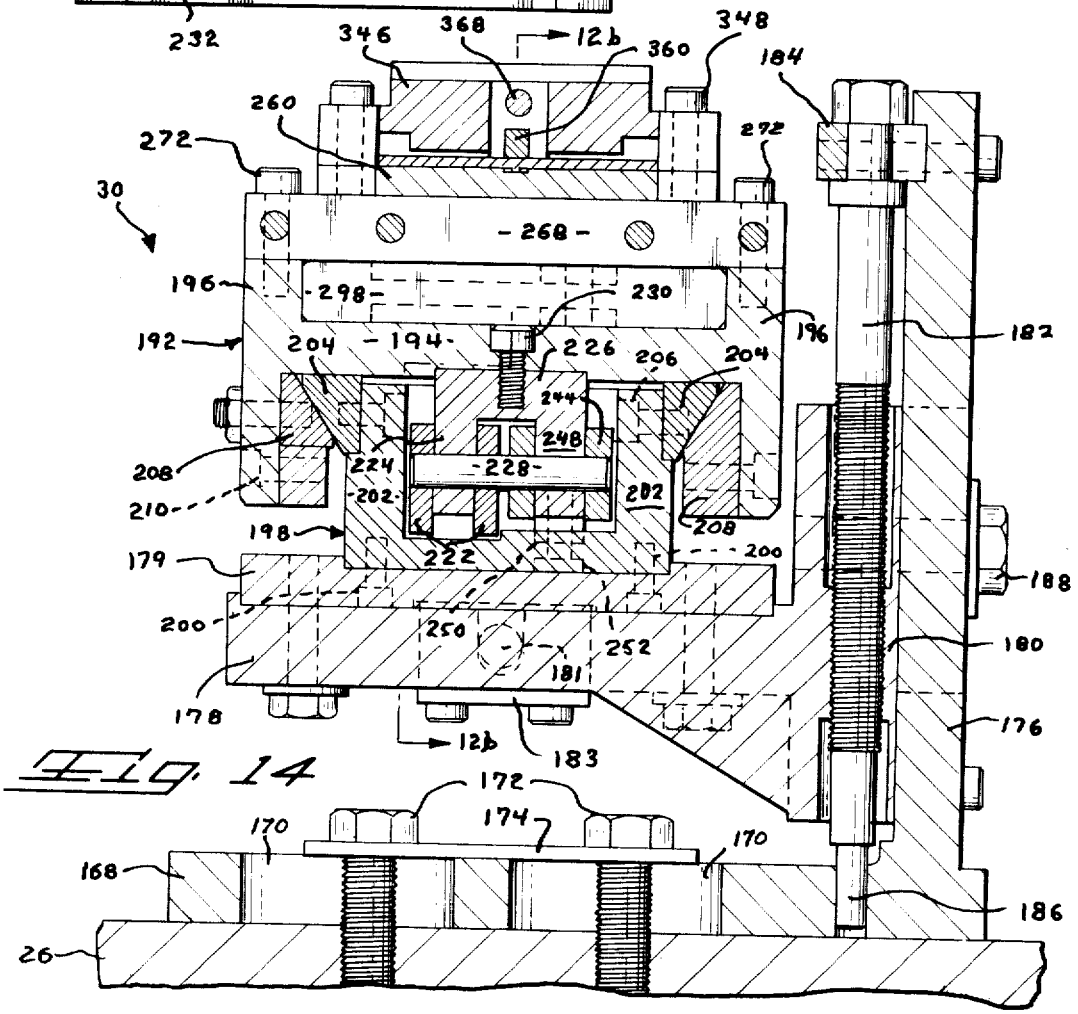

It will be apparent from the inspection of FIGS. 12B, 14, and 15 that the inserter can be adjusted towards and away from the turntable by means of the screw 181. Vertical adjustment of the position of the inserting head is achieved by means of the vertically adjustable support plate 178, and horizontal adjustment in a direction at right angles to the direction of movement of the plate 179 can be achieved by virtue of the plate 168. When the apparatus is being set up for a particular embodiment, the positions of each of the inserting mechanisms will be adjusted to insert a terminal into each of the openings in the bobbin being processed.

Each inserting mechanism or applicator is mounted on a generally H-shaped frame block 192 (FIG. 14) having a horizontally extending web 194 and sides 196. Web 194 is provided with an opening 193 intermediate its ends as shown best in FIG. 15. This frame block 192, in turn, is slidably mounted on a channellike support block 198, which is secured to the applicator base plate 179 by suitable fasteners 200. The sides 202 of the support block 198 have beveled bearing blocks 204 secured to their external surfaces by fasteners 206 and the lower portions of the sides 196 of the frame block 192 have complementary bearing members 208 secured thereto by fasteners 210. The support block 198 is thus anchored to the fixed applicator base plate 179 while the frame block 192, and the structure described below which is mounted thereon, is reciprocable towards and away from the turntable and towards a bobbin held on the turntable.

Reciprocation of frame block 192 is achieved by means of a piston cylinder 212 suitably mounted on the upper surface of the applicator support plate 179 and having a piston rod 214 with a coupling head 216 on its end. The head 216 is coupled at 220 to a connecting rod 218 which extends forwardly between the sides 202 of the support block 198 and which is bifurcated at its end as shown at 222 (FIG. 14). The spaced-apart ears on the end of this connecting rod straddle one side 224 of a U-shaped clevis block 226 and are pivotally connected to this side of the clevis block by means of a pin 228. The clevis block 226, in turn, is secured to the underside of the web 194 of the frame block 192 by suitable fasteners 230. It will be apparent that upon rightward and leftward movement of the piston rod 214, the applicator frame block 192 will be moved towards and away from the turntable. The shearing and terminal feeding mechanisms mounted on the applicator are actuated during such reciprocation of the piston rod by linkages which are described below.

A vertically reciprocable ram plate 232 is mounted slidably against the right-hand end of the applicator as viewed in FIG. 12B and is reciprocated by means of a lever 244 which extends beneath the web 194 of the frame member 192. The end portion 240 of this lever is of reduced thickness and is pivoted at 242 between a pair of spaced-apart ears of a coupling block 234. The coupling block, in turn, is secured by suitable fasteners 236 to the rearwardly facing side of the ram plate 232 as best shown in FIG. 12B.

Figure 17:
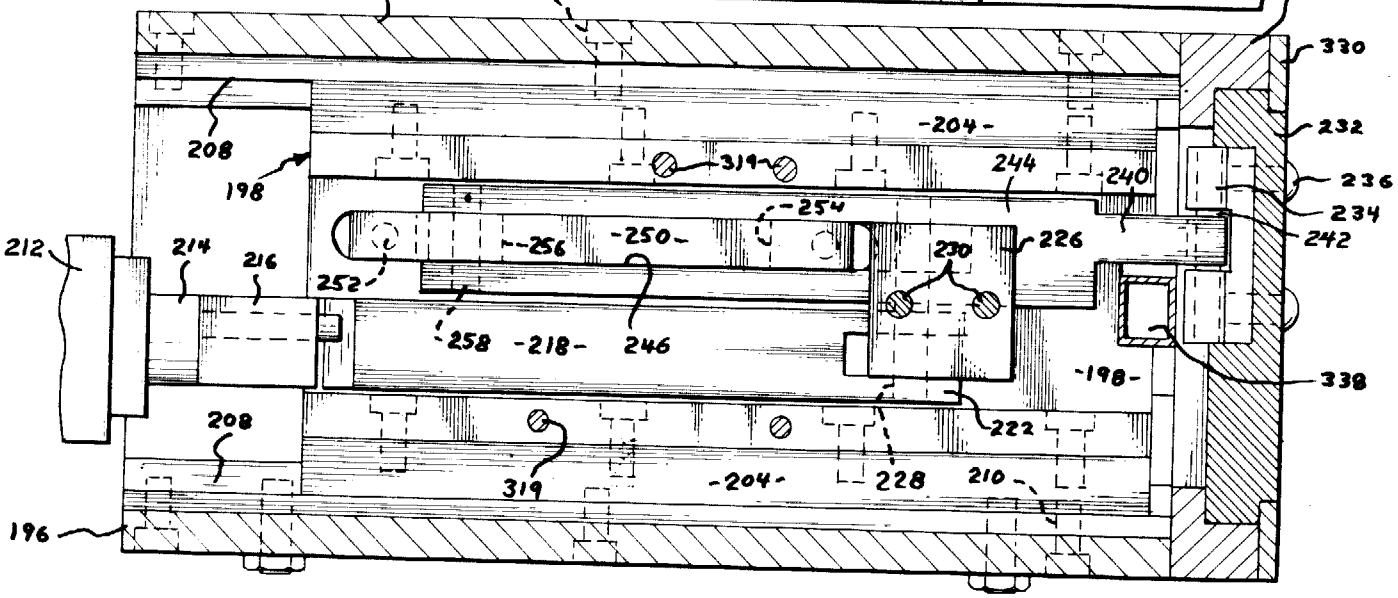

The lever 244 has an opening 246 (see FIG. 17) extending for a substantial portion of its length and one leg 248 of the previously identified clevis block 226 extends into this opening adjacent to the right-hand end of the lever as viewed in FIG. 17. Lever 244 is pivotally mounted on the previously identified pin 228 which extends through both legs 224, 248 of the clevis block 226 as best shown in FIG. 14. A fixed cam block 250 is secured to the support block 198 by means of suitable fasteners 252 and extends into the opening 246 of lever 244 on the left-hand side of block 226. This cam block is provided with a horizontally extending cam slot 254 which receives a cam follower 256. The cam follower 256 is mounted on a pin 258 which is mounted in the left-hand end of the lever 244 and which extends through the opening 246 in this lever and through the cam slot 254 as shown best in FIG. 17. As will be apparent from FIG. 12B, the shape of the cam slot 254 is such that when the lever moves rightwardly from the position of FIG. 12B, it will be rocked about its pivotal axis 228 through a slight clockwise arc thereby causing the ram plate 232 to be moved downwardly. Rearward movement of the lever with respect to this fixed cam plate 250 returns the ram plate 232 to its initial position. Since the lever 244 is secured to the reciprocable frame block 192 by means of the mounting block 226, such rocking of the lever takes place during each operating cycle. The downward movement of the ram plate 232 effects severing of the leading terminal of the strip from the next adjacent terminal as will be described below.

Figure 18:
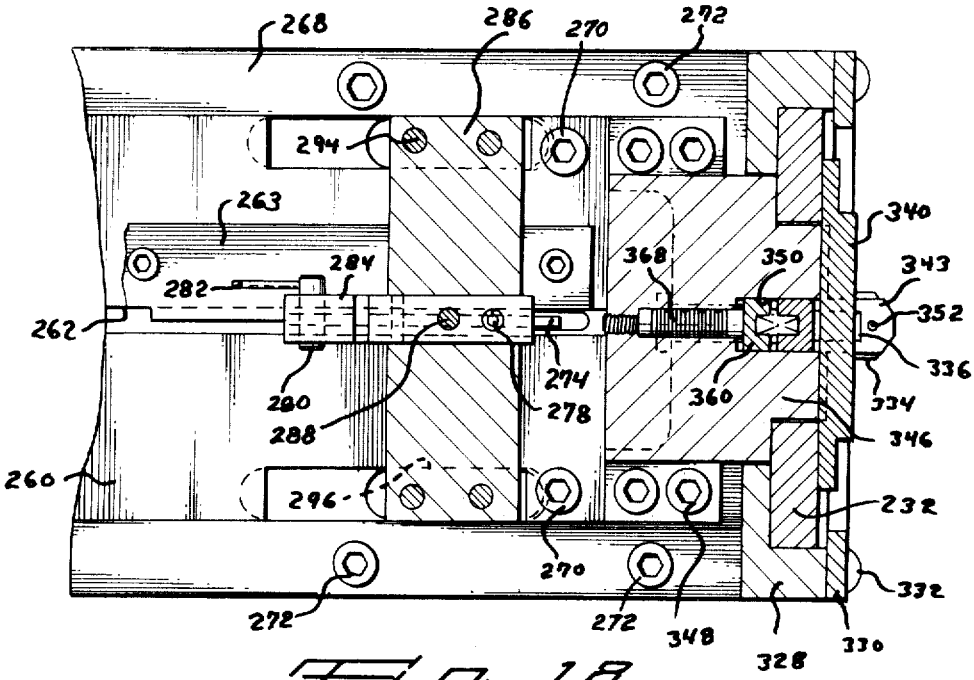

The terminal strip is fed toward the right-hand end of the applicator, as viewed in FIGS. 12A and 20 over the upper surface of the feed platform 260 having a groove 262 on its upper surface which serves as a guide. Additional guide means 263 in the form of flanges adapted to extend over the groove 262 are secured to the platform as best shown in FIG. 18. The terminal strip is fed from a suitable supply reel (not specifically shown) over an arcuate guide plate 264 which is secured to, and supported on, a bracket 266 which is mounted on the stationary base plate 179. It should be noted that the feed platform 260 reciprocates with the frame block 192 while this bracket 266 remains stationary. The feed platform 260 rests on a support block 268 and is secured thereto by fasteners 270, the support block 268, in turn, being secured by fasteners 272 to the upper ends of the sides 196 of the frame block 192, see FIG. 14.

The terminal strip is advanced by means of a feed finger 274 pivotally mounted intermediate its ends on a pin 276 which extends transversely across a feed finger housing 284. The forward end of this feed finger is biased downwardly by a spring 278 while the left-hand end, as viewed in FIG. 12B, bears against a slotted pin 280 mounted in the housing 284. An arm 282 extends laterally from the pin 280 so that upon rotation of the pin, the feed finger is moved upwardly against the biasing force of spring 278 to disengage it from the strip. Such disengagement of the finger from the strip is necessary when a new strip of terminals is being threaded through the applicator or when the applicator is otherwise being serviced.

Feed finger housing 284 is mounted in a reciprocable feed carriage 286 by means of a clamping screw 288 which extends downwardly through the carriage and into the housing, an adjusting screw 290 being provided in the carriage to accurately locate the housing, and, therefore, the stroke limits of the feed finger with respect to the carriage. The feed finger is reciprocated by means of the piston cylinder 212 in a manner which will be described below.

The feed finger and the feed carriage 286 move with the applicator towards and away from the turntable, and, in addition, move with respect to the applicator to advance the strip during the operating cycle. It is desirable to provide a pawl or detent mechanism on the applicator which is not moved with respect to the applicator and which permits feeding of the strip towards the right-hand end of the applicator prevents retractile movement of the strip. In the disclosed embodiment, a detent mechanism 292 is provided which is fixed to the upper surface of the platform 260. The parts of this detent or antibackup mechanism are precisely the same as the parts described above of the feed finger and need not, therefore, be specifically identified or described in detail. It need only be remembered, that this detent moves with the applicator but not with respect to the applicator as does the feeding mechanism.

Carriage 286 extends across the upper surface of the platform 260 and has its ends secured by fasteners 294 to a pair of downwardly extending straps 296, see FIGS. 15 and 18. The lower ends of these straps have a relatively snug fit in openings 300 in a feed slide 298 (see FIG. 15) which is disposed between the sides 196 of the H-shaped frame block 192 and which rests on the web portion of this block. A shallow recess 302 is provided on the right-hand end of the slide 298 and a link 304 has one of its ends pivoted in this recess as shown at 308. Link 304 is pivotally connected to an additional link 306 which, in turn, extends rearwardly of the applicator as viewed in FIG. 15 and is pivotally connected at 312 to a block 214. The block 314 is adjustably mounted, by means of an adjusting screw 316, between the sides 196 of the frame block so that it reciprocated with the frame block during operation. The link 306 has a cam follower 322 on its underside which is received in a cam slot 320 of a cam block 318. This cam block is secured by fasteners 319 to the upper surfaces of the sides 202 of the block 198 and extends into the opening 193 of the web portions of the frame block. It will be recalled that this block, in turn, is fixed to the applicator base plate 179 so that the cam block 318 does not reciprocate during the operating cycle.

FIG. 15 shows the positions of the parts at the beginning of the operating cycle and when the applicator is in its retracted position with respect to the turntable. During the operating cycle, the applicator moves rightwardly to the position of FIG. 16 and the cam follower 322 is required to move along the cam slot 320 in the block 318. Since the cam block 318 is fixed and does not move with the applicator, the toggle mechanism, comprising the links 304, 306, is broken (see FIG. 16) so that the slide 298 is moved relatively leftwardly with respect to the frame block 192. The feed carriage 286 is carried leftwardly with respect to the frame block since this carriage is rigidly connected to slide 298 by means of the straps 296 as previously explained. It will thus be apparent that the retraction of the feed carriage 286, that is, the movement of the carriage leftwardly with respect to the reciprocable frame block 192, takes place while the frame block itself is moving rightwardly as viewed in FIGS. 12 and 15, that is, towards the turntable. Feeding of the terminal strip takes place while the applicator is moving away from the turntable while retraction of the feed carriage takes place while the applicator is moving towards the turntable.

From the foregoing description, it will be apparent that the motion for the feed stroke is obtained from the reciprocable feed block by means of the block 314 and the toggle mechanism 304, 306 and the strips 296. It is desirable to provide a spring 324 which is effective between the slide 298 and the block 314 to bias these moving parts in one direction in order to take up any looseness in the drive train for the feed finger and to insure smooth operation thereof. In the disclosed embodiment, the spring 324 is interposed between the forwardly facing side of the block 314 and one side of the arm 298.

The shearing mechanism which shears the leading terminal of the strip from the next adjacent terminal is actuated at the beginning of the operating cycle by the lever 244 as previously described. The strip is fed through an opening 326 in the face of the reciprocable ram 232, the ram, in turn, being slidably mounted against the face of a housing 328 by means of clamping plates 330 and fasteners 332. As best shown in FIG. 15, the plates 330 retain the ram in the housing and the fasteners 332 function to hold the plates 330 and the housing 328 against the forward end of the reciprocable frame block. An insert 334 is mounted in the housing 328 by fasteners 335 (see FIG. 13) and has a downwardly and rearwardly extending opening 336, the edges of which cooperate with the shearing member 342 to sever the leading terminal from the strip and slug out the connecting slug between the adjacent terminals. The chip opening communicates with a chute 338 which extends downwardly to discharge the slugs as shown in FIG. 12.

The shearing member 342 is integral with, and depends from, a shearing block 340 which is secured by fasteners 344 to the face of the ram 232. At the beginning of the operating cycle, the strip will have been fed during the previous operating cycle so that the leading terminal will extend rightwardly as viewed in FIG. 12 beyond the opening 336. During downward movement of the ram then, the shearing member 342 will move into the opening 336 to effect the shearing operation and the connecting slug will drop downwardly and will be discharged through the chute 338. After the leading terminal has been severed from the strip and while it is being carried towards the bobbin and inserted into the bobbin opening, it is clamped on the upper surface of the insert 334 by a clamping structure which now will be described.

The clamping means for clamping the severed terminal is mounted on a block 346 (FIGS. 12, 18, and 19) which is contained between the sides of the reciprocable frame block and which is secured by fasteners 348 to the frame. Block 346 has an inwardly extending recess 350 centrally located on its right-hand side adjacent to the ram as shown in FIG. 18, this recess 350 accommodating a clamping member 351 and a slide member 360. As shown in FIG. 19, the clamping member 351 is in the form of a yolk having spaced-apart arms 354 which straddle the shear blade 342 and which are connected at their forward end as shown at 343. A locating pin 352 is mounted in the forward end of the clamp and extends downwardly against the surface of the insert 334, this pin being adjusted to enter the severed terminal between the trailing legs thereof to support it while it is being pushed into the bobbin. The underside of the forward section 343 of the clamping member is recessed as shown at 355 so that it will straddle the terminal and support it against lateral movement.

Clamping member 351 has an upstanding ear 358 at its rearward end and is pivotally connected by a pin 356 to the slide member 360. The slide member is slidably mounted in the lower portion of the recess 350 and has laterally extending flanges 372 at its rearward end which limit its rightward movement as viewed in FIGURE 12B beyond the position shown in that Figure. Slide member 360 is provided with an upstanding ear 364 which is opposed to the ear 352 and a compression spring 366 is interposed between these two ears so that the clamping member 351 is biased in a clockwise direction about the pivot pin 356, which connects the slide to the clamping member. Such biasing of the clamping member urges it against the surface of the leading terminal and urges the pin downwardly against the surface of the insert 334 so that it will back up the leading terminal. It will be apparent that this clamping member 351 can be displaced upwardly when the strip is fed to locate a terminal at the end of the applicator.

It is desirable to provide for a limited amount of overtravel of the applicator with respect to the bobbin into which the terminal is being inserted. The openings in the bobbins into which the terminals are inserted are not always of precisely the same depth and if the applicator is adjusted to insert a terminal fully into an opening of a precisely positioned bobbin, the next bobbin may have a shallower opening so that full insertion of the terminal will have been achieved before the applicator has reached the limit of its travel. In order to provide with such overtravel of the applicator, the center portion of the block 346, which is behind the ear 364, is provided with a drilled opening in which a plurality of compressible washers are mounted. A plug, as indicated, is mounted in the end of this opening and bears against the rearwardly facing side of the ear 364 and a set screw 370 is mounted in the opposite end of the opening to contain the washers. If a terminal is fully inserted prior to the end of the stroke of the applicator towards the turntable, the slide member 360 will thus be permitted to remain stationary relative to the applicator and the washers 368 will be compressed as is apparent from FIG. 12B. Only a slight clearance is provided between the left-hand side of the ear 364 and the opposed surface of the upper portion of the block 346. This clearance is adequate to provide for the limited overtravel which occasionally takes place.

The briefly review of the operating cycle of the disclosed embodiment, the bobbins are positioned on the bobbin mandrels of the holding jigs at a loading station. This may be carried out manually or by a suitable loading apparatus as desired. In any event, only approximate positioning of the bobbins is required for the reason that while the turntable indexes, and a previously loaded bobbin is carried to the first insertion station, the bobbin will be firmly clamped and precisely positioned on the mandrel 36 by the associated side clamp member 130 and clamping bar 76 (see FIGS. 5 and 6). As the bobbin is presented to each of the insertion stations, the applicators located at the stations move inwardly towards the turntable to insert a terminal. At the beginning of the operating cycle of each applicator, the terminal strip will have been fed so that the leading terminal extends beyond the end of the applicator. This leading terminal is sheared from the next adjacent terminal during movement of the applicator by the shearing blade 342 on block 340. The block 340 is mounted on the upper end of ram plate 232 which is moved downardly by lever 244 as the lever is swung about a slight clockwise arc (as viewed in FIG. 12B) by cam slot 254. After this leading terminal has been severed from the terminal strip, it is resiliently held against the upper surface of insert 334 by clamping member 351 until it is inserted into the bobbin.

The terminal strip is fed by the feed finger 274 which is pivotally mounted on the reciprocable feed carriage 286 by means of the feed finger housing 284. During movement of the applicator towards the turntable (i.e., during the insertion stroke of the applicator) the carriage and finger are retracted or moved a short distance away from the turntable by the toggle 304, 306 which is broken by cam slot 320. During retractile movement of the applicator, the toggle is straightened thereby to move the carriage and feed finger towards the turntable to feed the terminal strip relative to the applicator.

Any desired control and safety devices may be provided on the disclosed form of apparatus to detect, for example, the improper positioning of a bobbin on a holding jig of the end of a strip of terminals in any of the applicators and to shut down the machine upon receipt of a signal indicating such events. The only essential control circuitry required is for the piston cylinder 212 which is preferably of a double acting type and which is actuated at the beginning of the cycle to move the piston rod 214 rightwardly and is again actuated to move the piston rod 214 leftwardly after the terminal has been inserted into the bobbin. Such actuation of this piston cylinder can be achieved by a suitable solenoid controlled valve, which, in turn, is controlled by the turntable. The indexing mechanism for the turntable can be of any conventional type. It will be understood that any desired number of applicators can be mounted on the fixed table and that, if desired, the bobbins can be reversed or inverted after terminals have been inserted into one of the flanges to present a different flange to the succeeding applicators. The bobbins may be inverted by a suitable automatic mechanism or can be inverted manually and then repositioned in the holding jigs if desired. Finally, the bobbins can be automatically ejected for they are unclamped as previously described from the jigs after the final terminal has been inserted.

While the applicators of the disclosed embodiment are adapted to feed a single terminal strip, it will be apparent that the principles of the invention can be applied to the feeding of a plurality of terminal strips in each applicator. In other words, the applicator could be designed to feed two or more terminal strips along parallel paths and simultaneously insert two or more terminals into the bobbin or other insulating block. A modification of this type would be particularly beneficial for the insertion of contact terminals into printed circuit board connectors for the reason that connectors of this type commonly have 10, 20 or more terminals therein.

Changes in construction will occur to those skilled in the art and various apparently different modifications and embodiments may be made without departing from the scope of the invention. The matter set forth in the foregoing description and accompanying drawings is offered by way of illustration only.

We claim:

1. Apparatus for inserting contact members into insulating blocks comprising:

a turntable;

a plurality of block holding jigs mounted on said turntable at spaced-apart intervals on the periphery thereof;

a plurality of contact member inserters positioned at spaced locations around the periphery of said turntable, each of said inserters being movable relatively towards and away from said turntable and each inserter having means for feeding a strip of said terminal members, means for severing the leading terminal from said strip, and means for holding said leading terminal until it is inserted into an insulating block which is in alignment with said one inserting means; and said inserter being adjustably mounted to permit adjustment in three directions whereby said terminals can be inserted into openings at different locations on said block.

2. Apparatus for inserting terminals into bobbins comprising:

a turntable;

a plurality of terminal inserters, said inserters being located at spaced intervals around said turntable, each inserter comprising means for moving an individual terminal towards said turntable and into a predetermined target area;

a plurality of bobbin holding jigs on said turntable, each jig being adapted to hold a bobbin within said target area, and means for adjusting the positions of said terminal inserters to insert terminals at precisely predetermined locations in said target area thereby to permit insertion of terminals into each of several terminal-receiving openings in said bobbin.

3. Apparatus as set forth in claim 2 wherein each of said bobbin holding jigs has clamping means for clamping a bobbin in said predetermined target area, said apparatus including means actuated concomitantly with indexing of said turntable for actuating said clamping means while an individual jig is moving from a loading station to a first insertion station of said apparatus.

4. Apparatus as set forth in claim 3 wherein each of said jigs comprises a mandrel for supporting a bobbin, said clamping means on each jig comprising means for clamping said bobbin against said mandrel.

5. Apparatus as set forth in claim 2 wherein each of said inserters is reciprocable towards and away from said turntable during each operating cycle, terminal strip feeding means on each of said inserters, each of said feeding means being reciprocably mounted on said inserters to feed terminal strip relative to said inserters towards said turntable.

6. Apparatus as set forth in claim 5 wherein each of said inserters has severing means for severing the leading terminal from said strip and clamping means for resiliently clamping said severed terminal during movement of said inserter towards said turntable.

7. Apparatus as set forth in claim 6 wherein said clamping means, on each of said inserters, is slidably mounted on said inserter, and including resilient means biasing said clamping means relative to said turntable, towards said turntable, whereby said inserter is permitted to move relative to said clamping means in the event of complete insertion of a terminal prior to the completion of movement of said inserter towards said turntable.

8. An applicator for inserting a terminal into a bobbin, said bobbin being held in a fixed relationship with respect to said applicator, said apparatus comprising:

a slide member;

means for reciprocating said slide member towards and away from said bobbin;

strip feeding means on said slide member for feeding a strip of terminals towards and away from said bobbin with respect to said slide member;

severing means on said side member for severing the leading terminal from said strip; and clamping means for clamping said several terminal during movement of said slide member towards said bobbin, said clamping means being slidably mounted on said slide member and being resiliently biased towards said bobbin, whereby upon complete insertion of said terminal into said bobbin prior to the completion of movement of said slide member towards said bobbin, said slide member is permitted to move with respect to said clamping means until movement of said slide member towards said bobbin is completed.

*9. The method of attaching a contact element to a substrate comprising the steps of locating a substrate in a work position, feeding a contact element to a position adjacent the substrate, clamping the element between a pair of jaws in a fixed location relative to the substrate with a portion of the element exposed to the substrate, moving the jaws with the element clamped therebetween toward the substrate to attach the exposed portion of the element to the substrate at a desired location, and releasing the jaws.*

*10. The method of attaching a lug to a bobbin comprising the steps of mounting a bobbin in a work position,*

*feeding a strip of lugs toward the bobbin to position the lead lug of said strip adjacent the bobbin, clamping the lead lug between a pair of jaws with a portion thereof projecting from between the jaws toward the bobbin, severing the lead lug from the strip while clamped, moving said jaws with the lead lug clamped therebetween toward the bobbin to seat said lug portion in a lug-receiving pocket on the bobbin, and opening said jaws to release the lug.*

References Cited

The following references, cited by the Examiner, are of record in the patented file of this patent or the original patent.

UNITED STATES PATENTS

| | | | |
|---|---|---|---|
| 3,186,077 | 6/1965 | Vickery, Jr. | 29—203 B |
| 2,869,128 | 1/1959 | Reichelt | 227—105 |
| 3,134,982 | 6/1964 | Gagnon et al. | 227—93 X |
| 3,266,695 | 8/1966 | Cervenka et al. | 227—105 X |

THOMAS H. EAGER, Primary Examiner

U.S. Cl. X.R.

29—203.B